(12) United States Patent
Kerselaers et al.

(10) Patent No.: US 10,381,995 B1
(45) Date of Patent: Aug. 13, 2019

(54) VEHICLE RADIO INTERFERENCE SENSOR DEVICE

(71) Applicant: NXP B.V., Eindhoven (NL)

(72) Inventors: Anthony Kerselaers, Herselt (BE); Liesbeth Gommé, Anderlecht (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/040,179

(22) Filed: Jul. 19, 2018

(51) Int. Cl.
| | | |
|---|---|---|
| *H04B 1/10* | (2006.01) | |
| *H03G 3/34* | (2006.01) | |
| *B60L 11/18* | (2006.01) | |
| *G01R 29/08* | (2006.01) | |

(52) U.S. Cl.
CPC .......... *H03G 3/345* (2013.01); *B60L 11/1809* (2013.01); *G01R 29/08* (2013.01); *H03G 3/344* (2013.01); *H04B 1/10* (2013.01)

(58) Field of Classification Search
None
See application file for complete search history.

(56) References Cited

U.S. PATENT DOCUMENTS

| | | | | |
|---|---|---|---|---|
| 3,304,503 A | * | 2/1967 | Walker, Jr. ............. | H03G 3/345 455/224 |
| 4,068,159 A | * | 1/1978 | Gyugyi ................ | H02J 3/1864 323/211 |
| 5,140,263 A | * | 8/1992 | Leon ........................ | G01B 7/14 116/277 |
| 6,421,532 B1 | | 7/2002 | Lindenmeier et al. | |
| 2002/0039028 A1 | * | 4/2002 | Douglas ................... | G01R 1/07 324/658 |
| 2009/0011704 A1 | * | 1/2009 | Karabinis .......... | H04B 7/18534 455/13.4 |
| 2014/0072072 A1 | * | 3/2014 | Ismail .................... | H04B 1/525 375/269 |
| 2015/0069997 A1 | * | 3/2015 | Kawahata ................ | G01R 3/00 324/105 |
| 2015/0171709 A1 | * | 6/2015 | Ito .......................... | H02K 5/225 310/52 |
| 2016/0003775 A1 | * | 1/2016 | Parramore ............. | G01N 27/82 324/239 |
| 2017/0138986 A1 | * | 5/2017 | Kern ...................... | G01D 3/022 |
| 2018/0024175 A1 | * | 1/2018 | Quan ..................... | H04R 29/00 398/193 |
| 2018/0041318 A1 | * | 2/2018 | Sudo ...................... | H04L 1/0003 |
| 2018/0233126 A1 | * | 8/2018 | Zafeiropoulos .......... | G01H 1/00 |
| 2018/0258824 A1 | * | 9/2018 | Klietz .................... | B60K 13/04 |
| 2018/0340997 A1 | * | 11/2018 | Ibragimova ............. | A61N 2/002 |

FOREIGN PATENT DOCUMENTS

| | | |
|---|---|---|
| JP | 5599301 B2 | 10/2014 |
| JP | 5851364 B2 | 2/2016 |

* cited by examiner

*Primary Examiner* — Lana N Le
(74) *Attorney, Agent, or Firm* — Rajeev Madnawat

(57) ABSTRACT

An interference sensor device is disclosed. The interference sensor device includes a first conductive plate, a second conductive plate aligned parallel to the first conductive plate, a non-conductive matter between the first conductive plate and the second conductive plate and a coil electrically coupled to the first conductive plate and the second conductive plate.

9 Claims, 3 Drawing Sheets

000
VEHICLE RADIO INTERFERENCE SENSOR DEVICE

BACKGROUND

Interference occurs when unwanted radio frequency signals disrupt the use of automobile's radio system. Interference may prevent reception altogether, may cause only a temporary loss of a signal, or may affect the quality of the sound. The interference in automobile radios comes from a variety of sources. The most common sources for interference are electric and electronic systems in an automobile. One probable cause of this type of interference is the cars spark plug wires which degrade over time. Another source of interference can be the charging system of your car. The alternator which produces electricity to charge your cars battery is essentially a source of electro-magnetic energy.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, an interference sensor device is disclosed. The interference sensor device includes a first conductive plate, a second conductive plate aligned parallel to the first conductive plate, a non conductive matter between the first conductive plate and the second conductive plate and a coil electrically coupled to the first conductive plate and the second conductive plate.

In some examples, the interference sensor device further includes a first amplifier coupled to the first conductive plate and the second conductive plate and a second amplifier coupled to the sensor coil.

In another embodiment, a vehicle is disclosed. The vehicle includes the interference sensor device installed at the inside bottom of the chassis of the vehicle. In another example, the interference sensor device may be installed at the outside bottom of the chassis of the vehicle. In yet another example, the interference sensor device may be installed at inside top of chassis of the vehicle, above driver seat or at inside top of the chassis of the vehicle under the antenna.

In an example, a broadcast noise filtering system is disclosed. The broadcast noise filtering system includes the interference sensor device, a signal processor configured to receive a first signal from an antenna and a second signal from the interference sensor device and a phase/amplitude changer couple to the signal processor and the interference sensor device configured to be controlled by the signal processor through a feedback loop to correct phase of the second signal. The signal processor is configured to subtract the second signal from the first signal.

The broadcast filtering system may further include an antenna signal amplifier coupled between an antenna port and the signal processor and an interference signal amplifier coupled between the interference sensor device and the phase/amplitude changer.

BRIEF DESCRIPTION OF THE DRAWINGS

So that the way the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in detail in the description so as not to obfuscate the present disclosure.

Figure 1:
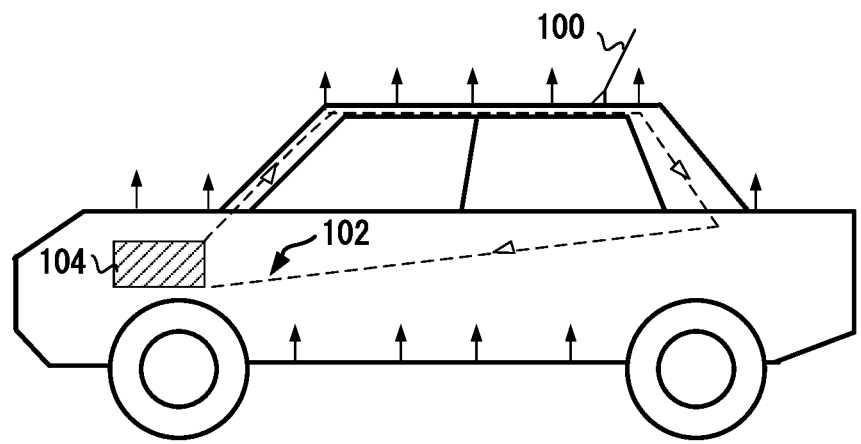
FIG. 1 depicts noise paths caused by automobile engine and electronic components.

FIG. 1 depicts noise paths caused by automobile engine and electronic components. The length of the rod antenna 100 is typically in the range of 10 centimeters to 80 centimeters cm. The rod antenna 100 is mounted on the rooftop of a vehicle. The received radio signals are amplified by a low noise amplifier positioned at the antenna feeding port. The feeding port has two feeding connections, the first connection is at the start of the rod antenna 100 close to the rooftop and the second connection is at the rooftop.

The engine 104 may be powered by batteries. When DC voltage is converted into variable AC voltage to drive the vehicles drive train, such conversion also generates electromagnetic fields. These electromagnetic fields induce current and voltage in the vehicle's chassis and rooftop. Since the rooftop is part of the antenna 100, the induced interference is coupled to the antenna feeding port. As depicted, the noise current path 102 passes through the rooftop and chassis and may interfere with the radio reception received through the antenna 100.

Figure 2:
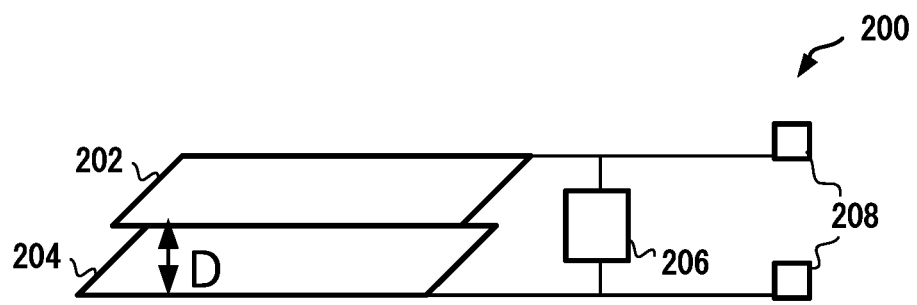
FIG. 2 shows a noise sensor in accordance with one or more embodiments.

FIG. 2 shows an interference sensor 200. The interference sensor 200 includes a first conductive plate 202 and a second conductive plate 204 separated from each other by the distance D. Between the first conductive plate 202 and the second conductive plate 204, there may be a non-conductive material or air. The interference sensor 200 also includes a sensor coil 206 that is energized by the electromagnetic field captured by the first conductive plate 202 and the second conductive plate 204 as well as the radio interference captured directly. The interference sensor 200 includes two connecting ports 208 to couple the interference sensor 200 with a noise reduction circuit (now shown).

Figure 3:
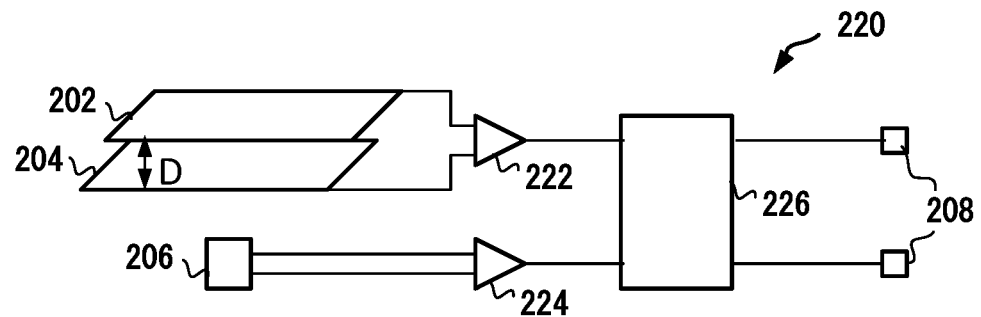
FIG. 3 shows a noise sensor in accordance with one or more embodiments.

FIG. 3 shows an interference sensor 220 in another embodiment. The interference sensor 220 includes the first conductive plate 202 and the second conductive plate 204 separated from each other by an arbitrary distance D. The first conductive plate 202 and the second conductive plate 204 are coupled to a first amplifier 222. The interference sensor 220 further includes the sensor coil 206 coupled to a second amplifier 224. The output of the first amplifier 222 and the second amplifier 224 are combined using an adder 226 that adds amplified signals from the two conductive plates 202, 204 and from the sensor coil 206.

Figure 4:
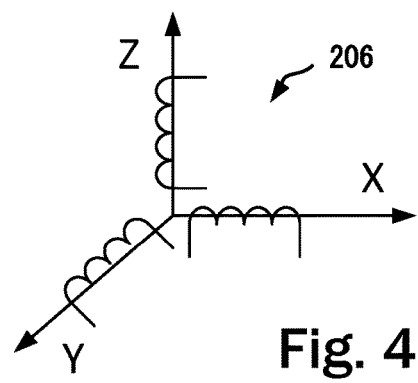
FIG. 4 shows a noise sensing coil in accordance with one or more embodiments.

FIG. 4 shows a schematic of the sensor coil 206. In some embodiments, the sensor coil 206 includes only one directional coil, e.g., a coil in X direction only. In another example, the sensor coil 206 may include coils in X and Y directions. Coils in three directions provide a better sensing as it can pick up the electromagnetic emission in all three directions and combine the sensed voltage. The coil may be a planar coil or a coil on a ferrite rod.

Figure 5:
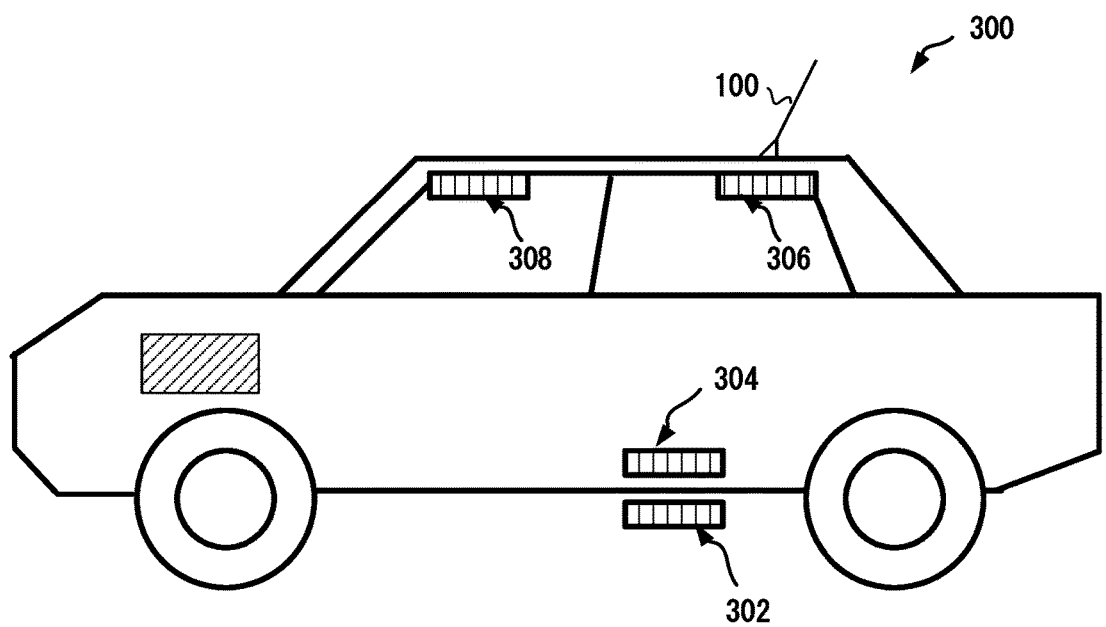
FIG. 5 shows a plurality of noise sensors installed in an automobile in accordance with one or more embodiments.

FIG. 5 shows an example of placement of the interference sensors 200 or 220 in a vehicle 300. The interference sensor 200 or 220 is placed where the reception of the broadcast signal is minimal, e.g., inside the vehicle 300 and where the interference is correlated with the interference received by the antenna 100. The chassis of the vehicle 300 creates a faraday cage, hence the broadcast signal inside the vehicle 300 is the minimal. As depicted, one or more interference sensors 200 or 220 may be placed inside the vehicle 300 above driver's seat. Alternatively, the interference sensor 200 or 220 may be placed inside the vehicle 300 towards the rear under the antenna 100. Under the chassis of the vehicle 300 may also be an advantageous position because the radio signals are attenuated due to the ground which is capacitive coupled to the lower side of the chassis.

Figure 6:
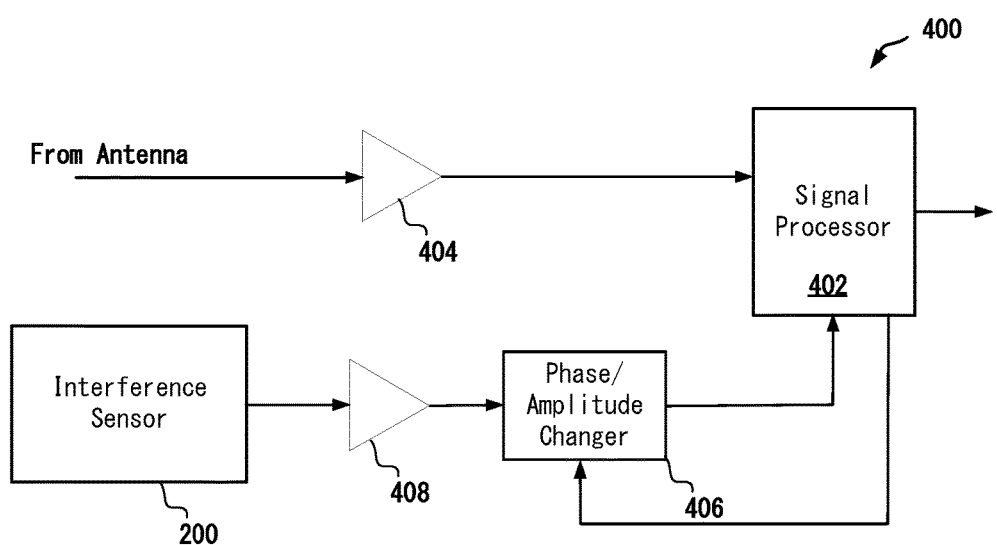
FIG. 6 shows a noise cancellation circuit in accordance with one or more embodiments.

FIG. 6 shows a noise cancellation circuit 400. The noise cancellation circuit 400 includes an interference sensor 200. In some embodiments, the interference sensor 220 may also be used. As discussed in FIG. 5, the interference sensor 200 may be installed in a vehicle where there is a minimal amount of broadcast signal. The interference sensor 200 is installed coupled to the chassis of the vehicle. The interference captured by the interference sensor 200 is amplified by a low noise amplifier 408 and the amplified signal is inputted to a phase and amplitude changer 406 which is controlled by a signal processor 402. The phase and amplitude changer 406 is configured to produce a signal that is correlated to the signal from the antenna and similar in amplitude to the signal from the antenna after amplification by the low noise amplifier 406. The signal from the antenna includes the broadcast signal as well as the interference signal. The signal processor 402 the subtract the signal from the interference sensor path from the signal from the antenna path to produce a relatively noise and interference free broadcast signal.

Going back to FIG. 5, the interference sensor 304 is installed close to the chassis of the vehicle 300 and is capacitively coupled to the chassis. Due to the electric field vector orientation, the interference field induces a voltage between the plate 202 and the plate 204. The field to voltage transfer function may be defined as follows:

$$V_1(x) = E(x)DQ \frac{C_s}{\varepsilon r(C_s + C_{amp})}$$

Where:
$V_1$=induced voltage
E=electric interference field
D=distance between the plates
Cs=capacity formed by the two plates Camp=capacity of the amplifier connected to the sensor
$\varepsilon r$=dielectric constant of the substrate between the two plates
Q=quality factor of the sensor including amplifier
x=position on the chassis The conductive plates are measuring the common model signal which is represented by the electric field on the chassis of the vehicle 300. The differential mode signal, which are the circulating currents can be measured by means of their magnetic field. The magnetic field is captured by the sensor coil 206.

The conversion from magnetic interference fields to voltage in one coil can be defined as follows:

$$V_2(x) = Q 2\pi N\, Su\mu_0\mu_r H(x) F$$

Where:
N=the number of turns in the coil
F=frequency
Su=surface area of the coil core
H=the magnetic field at the receive coil
$\mu_o$=4·pi·$10^{-7}$ H/m is magnetic permeability of vacuum
$\mu_r$=relative magnetic permeability of the receive coil rod
x=position at the chassis
Q=quality factor of sensor including amplifier Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An interference sensor device, comprising:
   a signal adder having two input ports and two output ports;
   a first conductive plate;
   a second conductive plate aligned parallel to the first conductive plate;
   a non-conductive matter between the first conductive plate and the second conductive plate, wherein the first conductive plate is coupled to a first input of a first amplifier and the second conductive plate is coupled to a second input of the first amplifier, wherein an output of the first amplifier is coupled to a first of the two input ports of the signal adder; and
   a sensor coil having two ports each electrically coupled to a first input and a second input of a second amplifier, wherein an output of the second amplifier is coupled to a second of the two input ports of the signal adder.

2. The interference sensor device of claim 1, wherein the signal adder is configured to add signals received from the first and the second conductive plates and the sensor coil to produce a combine signal.

3. The interference sensor device of claim 1, wherein the signal adder is configured to be coupled to an amplifier through the two output ports.

4. A vehicle, comprising the interference sensor device of claim 1 installed at the inside bottom of chassis of the vehicle.

5. A vehicle, comprising the interference sensor device of claim 1 installed at the outside bottom of chassis of the vehicle.

6. A vehicle, comprising the interference sensor device of claim 1 installed at the inside top of chassis of the vehicle, above the driver seat.

7. A broadcast noise filtering system, comprising:
   an interference sensor device including a first conductive plate, a second conductive plate aligned parallel to the first conductive plate, a non-conductive matter between the first conductive plate and the second conductive plate and a sensor coil electrically coupled to the first conductive plate and the second conductive plate;
   a signal processor configured to receive a first signal from an antenna and a second signal from the interference sensor device; and
   a phase/amplitude changer coupled to the signal processor and the interference sensor device configured to be controlled by the signal processor through a feedback loop to correct phase and amplitude of the second signal;
   wherein the signal processor is configured to subtract the second signal from the first signal.

8. The broadcast noise filtering system of claim 7, further including an antenna signal amplifier coupled between an antenna port and the signal processor.

9. The broadcast noise filtering system of claim 7, further including an interference signal amplifier coupled between the interference sensor device and the phase/amplitude changer.

* * * * *